US011726154B2

(12) United States Patent
Hattaha et al.

(10) Patent No.: US 11,726,154 B2
(45) Date of Patent: Aug. 15, 2023

(54) MRI APPARATUS

(71) Applicant: CANON MEDICAL SYSTEMS CORPORATION, Otawara (JP)

(72) Inventors: Misaki Hattaha, Sakura (JP); Sadanori Tomiha, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/646,746

(22) Filed: Jan. 3, 2022

(65) Prior Publication Data

US 2022/0229130 A1 Jul. 21, 2022

(30) Foreign Application Priority Data

Jan. 21, 2021 (JP) ................................ 2021-008023

(51) Int. Cl.
*G01R 33/38* (2006.01)
*G01R 33/54* (2006.01)
*G01R 33/565* (2006.01)
*G01R 33/385* (2006.01)

(52) U.S. Cl.
CPC ....... *G01R 33/3806* (2013.01); *G01R 33/385* (2013.01); *G01R 33/543* (2013.01); *G01R 33/56509* (2013.01)

(58) Field of Classification Search
CPC ............. G01R 33/3806; G01R 33/385; G01R 33/543; G01R 33/56509
See application file for complete search history.

(56) References Cited

U.S. PATENT DOCUMENTS

| 4,875,485 | A  | * | 10/1989 | Matsutani | .............. | G01R 33/28 324/318 |
| 2002/0123681 | A1 | * | 9/2002 | Zuk | ........................ | A61B 5/055 600/410 |
| 2012/0136239 | A1 | * | 5/2012 | Scarth | .............. | G01R 33/34046 600/411 |
| 2018/0038218 | A1 | * | 2/2018 | Hay | ......................... | E21B 7/04 |

FOREIGN PATENT DOCUMENTS

| JP | 2002-532126 A | 10/2002 |
| WO | WO 00/35346 | 6/2000 |

* cited by examiner

*Primary Examiner* — Dixomara Vargas
(74) *Attorney, Agent, or Firm* — Oblon, McClelland, Maier & Neustadt, L.L.P.

(57) ABSTRACT

In one embodiment, an MRI apparatus includes: a current-driven magnet configured to generate a magnetic field that predominantly determine a magnetic resonance frequency; a detector configured to detect a position of an object to be imaged in a movable state in the magnetic field; and control circuitry configured to set an imaging region of the object depending on a motion of the object by controlling a drive current of the current-driven magnet based on the detected position of the object.

15 Claims, 9 Drawing Sheets

MRI APPARATUS

CROSS-REFERENCE TO RELATED APPLICATION

This application is based upon and claims the benefit of priority from Japanese Patent Application No. 2021-008023, filed on Jan. 21, 2021, the entire contents of which are incorporated herein by reference.

FIELD

Disclosed embodiments relate to a magnetic resonance imaging (MRI) apparatus.

BACKGROUND

An MRI apparatus is an imaging apparatus which magnetically excites nuclear spin of an object placed in a static magnetic field with a radio frequency (RF) pulse having the Larmor frequency and reconstructs an image on the basis of magnetic resonance (MR) signals emitted from the object due to the excitation.

Many MRI apparatuses have a configuration called a gantry, and a cylindrical space called a bore is formed in the gantry. An object (for example, a patient) lying on a top plate is imaged while being carried into a cylindrical space. The gantry houses a cylindrical static magnetic field magnet, a cylindrical gradient coil, and a cylindrical RF coil, i.e., a WB (Whole Body) coil. Since, in many conventional MRI apparatus, the static magnetic field magnet, the gradient coil, and the RF coil are configured to be cylindrical, an MRI apparatus having this type of structure will be referred to as a cylindrical MRI apparatus hereinafter.

In the cylindrical MRI apparatus, since the image is taken in the closed space in the bore, imaging may be difficult for some patients having claustrophobia, for example.

On the other hand, another type of an MRI apparatus has been developed, in which the static magnetic field magnets, the gradient coil, and the RF coil are formed in the shape of a flat plate so that imaging of the object is performed in the open space sandwiched between two planar static magnetic field magnets. Hereinafter, an MRI apparatus having this type of structure will be referred to as a planar open magnet MRI system or a planar open magnet MRI apparatus. In the planar open magnet MRI apparatus, since imaging is performed in the open space, even a patient having claustrophobia can be imaged.

When using the cylindrical MRI apparatus, imaging is performed in a narrow and closed space, so the motion of the patient is restricted. By contrast, when using the planar open magnet MRI apparatus, since the patient is imaged in an open space, the degree of freedom of movement is high, and the patient may have more movement during imaging. In general, imaging using an MRI apparatus takes a relatively long time regardless of the cylindrical MRI apparatus or the planar open magnet MRI apparatus, so it is difficult for the patient to maintain the same posture but to move during imaging. Because it is difficult to restrict the patient's movement using the planer open magnet MRI apparatus, it becomes more difficult to generate a normal image if the patient moves during imaging.

DETAILED DESCRIPTION

Hereinafter, embodiments of the present invention will be described by referring to the accompanying drawings.

In one embodiment, an MRI apparatus includes: a current-driven magnet; a detector; and control circuitry. The current-driven magnet generates a magnetic field that predominantly determines a magnetic resonance frequency. The detector detects a position of an object to be imaged in a movable state in the magnetic field. The control circuitry controls a drive current of the current-driven magnet on the basis of the detected position of the object so as to set an imaging region of the object depending on a motion of the object.

First Embodiment

Figure 1:
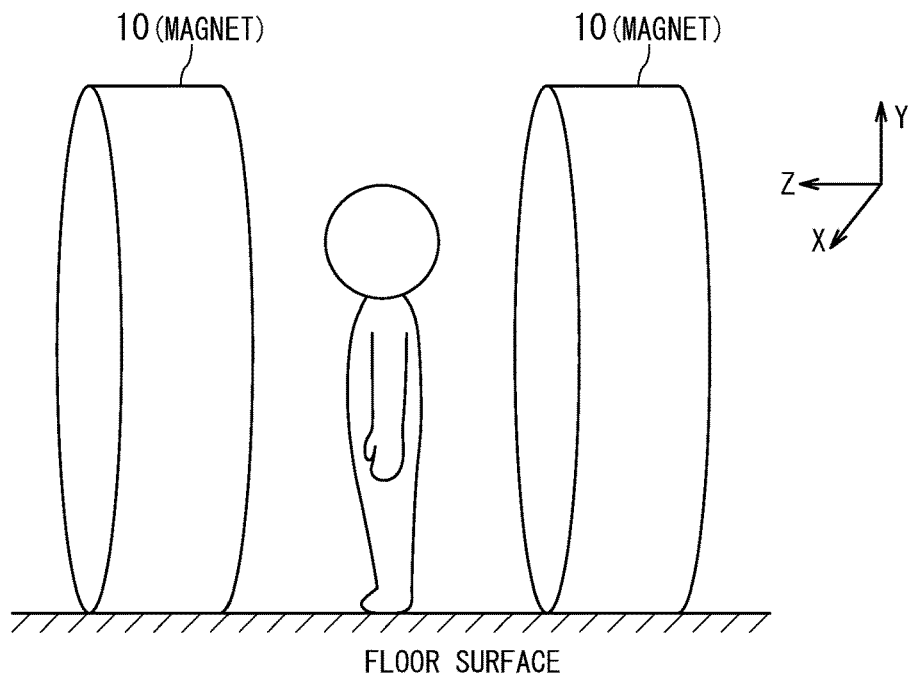
FIG. 1 is a block diagram illustrating the first operation concept of a planar open magnet MRI apparatus according to one embodiment.

FIG. 1 illustrates a first configuration of a planar open magnet MRI apparatus 1 according to the first embodiment. As shown in FIG. 1, the MRI apparatus 1 has, for example, two magnets 10 in the shape of a circular flat plate (i.e., a pair of thin cylindrical magnets 10).

The respective magnets 10 are arranged such that the central axis of each magnet 10 (i.e., the axis passing through the center of the both circular end faces of the cylindrical shape) is parallel to, for example, the floor surface. In addition, the two magnets 10 are arranged so as to sandwich the object such as a patient. This arrangement of magnets 10 generates a magnetic field in the open space between the two magnets 10. The object is imaged in this open space, for example, in a standing position.

In a conventional cylindrical MRI apparatus, the magnetic field that predominantly determines the magnetic resonance frequency is called a static magnetic field, and the static magnetic field is generated by a static magnetic field magnet. The static magnetic field magnet is configured to always generate a magnetic field of constant strength. For example, when the static magnetic field magnet is configured using a superconducting coil, a static magnetic field is generated by applying a current supplied from a static magnetic field power supply to the superconducting coil in an excitation mode. Afterward, when the static magnetic field magnet shifts to a permanent current mode, the static magnetic field power supply is disconnected and the static magnetic field magnet continues to generate a magnetic field of constant strength. The static magnetic field magnet can also be configured as a permanent magnet. Also in this case, the magnetic field strength to be generated by the permanent magnet as the static magnetic field magnet is always constant.

The magnets 10 of the present embodiment are also the same as the conventional static magnetic field magnet in terms of generating a magnetic field that predominantly determines the magnetic resonance frequency. However, the magnets 10 of the present embodiment are significantly different from the conventional static magnetic field magnet in that the magnets 10 are configured as electromagnets to be driven by an electric current even during operation (i.e., during imaging) as described below. Strictly speaking, the magnetic field generated by the magnets 10 is not a "static magnetic field" because the magnets 10 of the present embodiment can change the magnetic field strength depending on the magnitude of the driving current. In the following, the magnetic field to be generated by the magnets 10 of the present embodiment is referred to as a "main magnetic field" or simply referred to as a "magnetic field".

Figure 2:
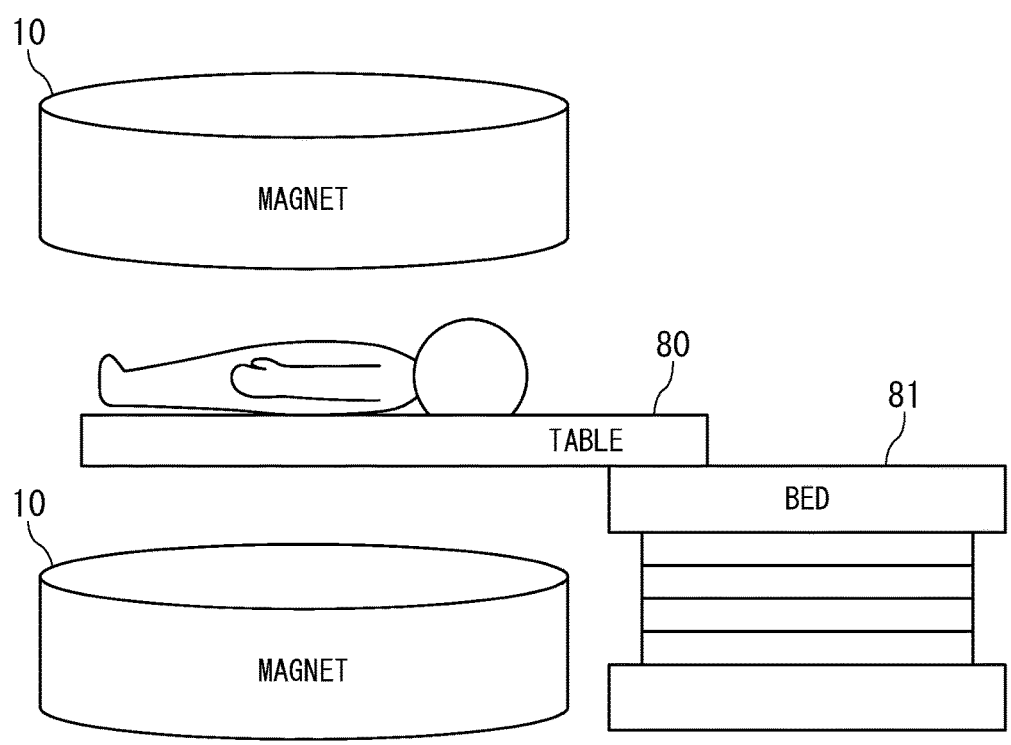
FIG. 2 is a block diagram illustrating the second operation concept of the planar open magnet MRI apparatus according to the one embodiment.

FIG. 2 illustrates a second configuration of the planar open magnet MRI apparatus 1 according to the first embodiment. FIG. 1 illustrates a configuration of imaging an object in a standing position, whereas, FIG. 2 illustrates a configuration of imaging an object in a lying position, i.e., lying on a table 80 extending from a bed 81. In the case of imaging an object in the lying position, the two magnets 10 are arranged such that their central axes are in the vertical direction as shown in FIG. 2, for example, one magnet 10 is disposed below the table 80 and the other magnet 10 is disposed above the table 80.

As shown in FIG. 1 and FIG. 2, in the imaging by using the magnets 10 of the present embodiment, the object can be imaged in an open magnetic field space, and thus, even a patient having claustrophobia can be imaged, for example. However, because imaging by using the magnets 10 is performed in an open space, the degree of freedom of motion is high. Consequently, the object is more likely to move during imaging.

Thus, the magnets 10 of the present embodiment are configured as current-driven magnets (i.e., electromagnets) as described above. The drive current to be applied to the magnets 10 is controlled depending on the motion of the object or the position of the object so as to change the spatial distribution of the magnetic field, which predominantly determines the magnetic resonance frequency. As a result, the MRI apparatus 1 can move the imaging region of the object (i.e., region where a signal having a predetermined magnetic resonance frequency is obtained from the object) depending on the motion of the object or the position of the object.

Figure 3A:
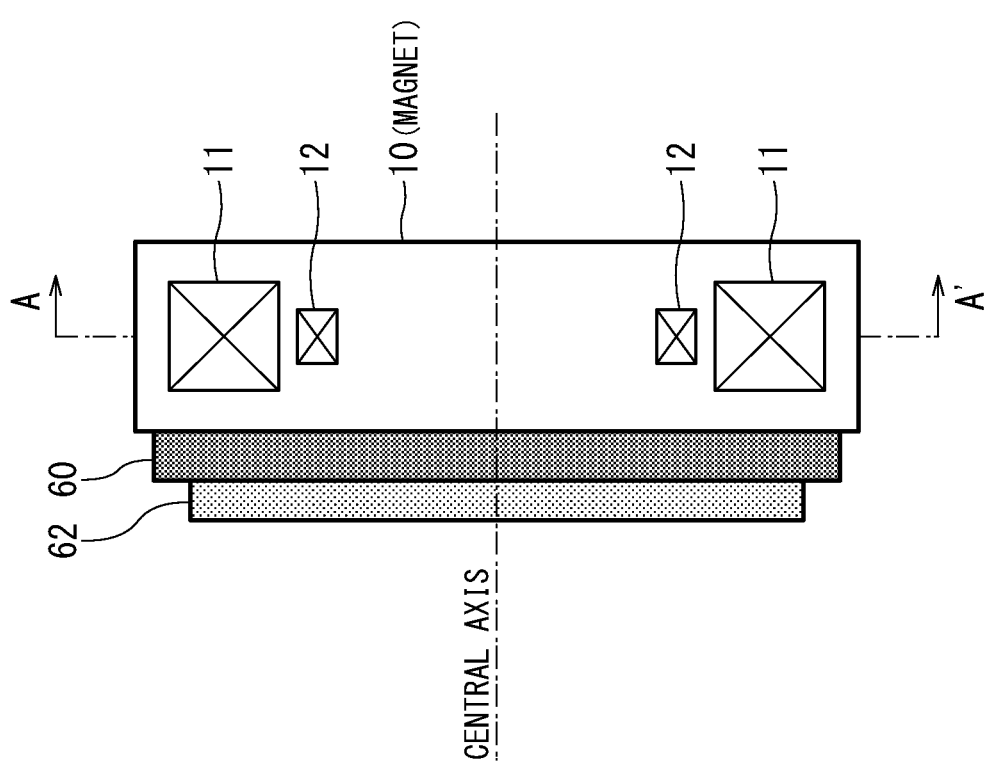
FIG. 3A and FIG. 3B are diagrams illustrating internal structure of magnets according to the one embodiment.
Figure 3B:
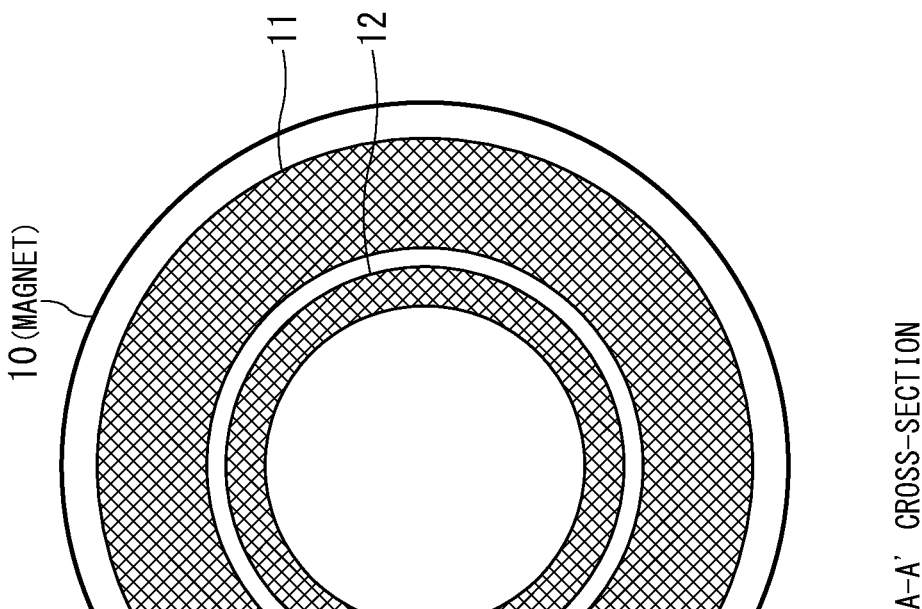

FIG. 3A and FIG. 3B illustrate the internal configuration of the magnets 10. FIG. 3A illustrates an internal cross-section of the magnets 10 as viewed from the direction orthogonal to the central axis. FIG. 3B is a cross-sectional view taken along the line A-A' of FIG. 3A, illustrating an internal cross-section of the magnets 10 as viewed from the central axis direction.

The magnets 10 are composed of one or more coil units, and the one or more coil units are housed in, for example, a flat plate-shaped magnet-housing that has a predetermined thickness as shown in FIG. 3A and FIG. 3B. In the case shown in FIG. 3A and FIG. 3B, for example, two circular coil units (i.e., coil units 11 and 12) having different cross-sectional areas are housed in the magnet-housing.

Each of the coil units 11 and 12 is configured as an electromagnet, and magnetic field strength thereof changes depending on the magnitude of the drive current. The coil units 11 and 12 may be configured as superconducting electromagnets or as normal conducting electromagnets. The coil units 11 and 12 generate a magnetic field (i.e., a main magnetic field) that predominantly determines the magnetic resonance frequency.

A gradient coil assembly 60 and an RF coil 62 are disposed adjacent to the magnet-housing. The gradient coil assembly 60 generates a gradient magnetic field to be superimposed on the main magnetic field. The RF coil 62 applies a radio frequency (RF) pulse to the object and receives a magnetic resonance (MR) signal emitted from the object.

The gradient coil assembly 60 includes, for example, an X-axis gradient coil, a Y-axis gradient coil, and a Z-axis gradient coil. The gradient coil of each axis is configured as, for example, a flat plate coil. The RF coil 62 is also configured as, for example, a flat plate coil.

Figure 4:
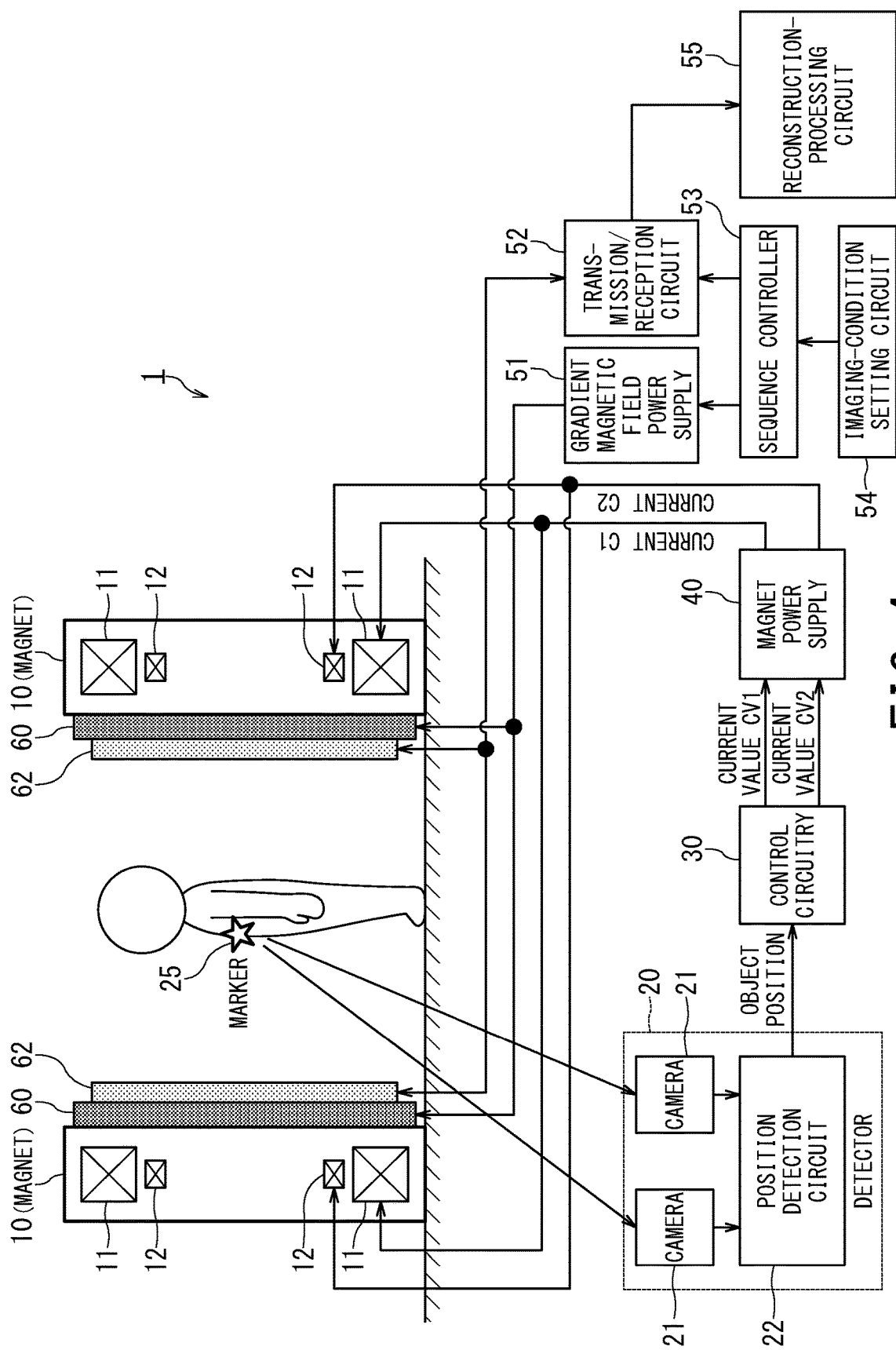
FIG. 4 is a block diagram illustrating a configuration of the MRI apparatus according to the first embodiment.

FIG. 4 is a block diagram illustrating a configuration of the MRI apparatus 1 provided with the above-described magnets 10 in the first embodiment. This MRI apparatus 1 is provided with two magnet units, each of which includes: the magnet 10 shown in FIG. 3A and FIG. 3B; the gradient coil assembly 60; and the RF coil 62. The two magnet units are arranged so as to face each other with the object interposed therebetween. In addition to the two magnet units, the MRI apparatus 1 includes at least a detector 20, control circuitry 30, and a magnet power supply 40. The detector 20 detects the position of the object to be imaged in a movable state in the magnetic field generated by the magnets 10.

The control circuitry 30 calculates the current values of the respective drive currents to be applied to the magnets 10 on the basis of the position of the object detected by the detector 20. Since each of the magnets 10 illustrated in FIG. 4 has two coil units 11 and 12, the current value CV1 for the coil unit 11 and the current value CV2 for the coil unit 12 are calculated respectively. By controlling the current values CV1 and CV2, the imaging region of the object can be set depending on the motion of the object.

The magnet power supply 40 generates currents C1 and C2 respectively corresponding to the current values CV1 and CV2 calculated by the control circuitry 30 and applies the currents C1 and C2 to the respective two coil units 11 and 12 as drive currents.

The currents C1 and C2 generated by the magnet power supply 40 are respectively applied to the coil units 11 and 12, and the magnets 10 generate a magnetic field that has distribution of magnetic field strength corresponding to the currents C1 and C2.

In the configuration shown in FIG. 4, the currents C1 and C2 are supplied to the respective two magnets 10 on the right and left sandwiching the object, and are applied to the respective coil units 11 and 12 of the magnets 10. However, the MRI apparatuses 1 of embodiments are not limited to this configuration.

For example, of the two magnets 10 on the right and left sandwiching the object, only one of the magnets 10 (for example, only the magnet 10 on the right side in FIG. 4) may be supplied with the currents C1 and C2 which current values are controlled to change depending on the position of the object, while the other magnet 10 is being supplied with a current of a constant current value. Alternatively, the other magnet 10 may be disconnected from the power supply and shift to a permanent current mode after generating a predetermined static magnetic field in the excitation mode, so as to continue to operate in the permanent current mode.

Although the currents C1 and C2 are respectively applied to the coil units 11 and 12 in the configuration shown in FIG. 4, embodiments of the present invention are not limited to this configuration. For example, one current (e.g., current C1) may be applied to both of the coil units 11 and 12 by connecting the coil units 11 and 12 in series or in parallel.

In addition to the above-described components, the MRI apparatus 1 of the present embodiment further includes: a gradient magnetic field power supply 51; a transmission/reception circuit 52; a sequence controller 53; an imaging-condition setting circuit 54; and a reconstruction-processing circuit 55 as shown in FIG. 4.

The imaging-condition setting circuit 54 sets imaging conditions such as the type of pulse sequence and various parameter values related to the pulse sequence, which are inputted via a user interface (not shown), for the sequence controller 53.

The sequence controller 53 performs a scan of the object by driving the gradient coil power supplies 51 and the transmission/reception circuit 52 on the basis of the set imaging conditions. The gradient magnetic field power supply 51 applies a gradient-magnetic-field current to the gradient magnetic field coil 60 on the basis of a drive signal from the sequence controller 53.

The transmission/reception circuit 52 generates RF pulses on the basis of the drive signal from the sequence controller 53, and applies the RF pulses to the RF coil 62. The RF coil 62 applies the RF pulses to the object, and subsequently receives MR signals emitted from the object in response to the RF-pulse application. The MR signals received by the RF coil 62 are converted from analog signals to digital signals by the transmission/reception circuit 52. The MR signals converted into the digital signals are inputted as k-space data into the reconstruction-processing circuit 55.

The reconstruction-processing circuit 55 generates a magnetic resonance image by performing reconstruction processing such as inverse Fourier transform on the k-space data.

Each of the imaging-condition setting circuit 54, the sequence controller 53, and the reconstruction-processing circuit 55 may be configured as, for example, a circuit including a processor for executing predetermined programs, or may be configured as hardware such as a field programmable gate array (FPGA) and/or an application specific integrated circuit (ASIC).

In the MRI apparatus 1 according to the first embodiment, the detector 20 includes cameras 21 and a position detection circuit 22. Each camera 21 images a marker 25 that is attached to the object, or a marker 25 that is attached to the reception surface-coil mounted on the object. The position detection circuit 22 detects the position of the marker 25 from the images of the marker 25 imaged by the respective cameras 21, and uses the position of the marker 25 for detecting the position of the imaging target in the object, for example, an organ such as a heart or a lung, or a body part such as a shoulder or a knee.

When detecting the position of the object in three dimensions of the X-axis, Y-axis, and Z-axis, one or more cameras 21 are installed such that the position of the object is detected from images of the marker 25 imaged from one or more directions. When the position of the object is limited to the one-axis direction such as the Z-axis direction by limiting the motion of the object with maybe a jig, the position of the object can be detected by using only one camera 21.

The detector 20 continues to operate during imaging. Even when the object moves in the imaging space, the detector 20 continuously detects not only the respective position of the imaging target before or after the movement, but also positions of the imaging target during movement.

The control circuitry 30 and the magnet power supply 40 control the currents C1 and C2, which is applied to the coil units 11 and 12, on the basis of the position of the imaging target detected by the detector 20 such that the magnetic field strength generated by the magnets 10 (i.e., coil units 11 and 12 in FIG. 4) matches the desired magnetic field strength at the detected position of the imaging target.

The distribution profile of a magnetic field can be formed with high degree of freedom, by providing two or more coil units in the magnet 10 and by setting the value and direction of the current independently for each coil unit.

It is also possible to provide only one coil unit in the magnet 10.

The spatial distribution of the magnetic field is three-dimensional in the X-axis, Y-axis, and Z-axis directions. The Z-axis direction corresponds to the central axis direction of each magnet 10 and is, for example, the direction parallel to the floor surface. The Y-axis direction is a direction orthogonal to the central axis, and is, for example, the vertical direction. The X-axis direction is orthogonal to both of the Z-axis direction and the Y-axis direction and is, for example, the direction perpendicular to the sheet of drawing.

When the respective currents applied to the coil units 11 and 12 are changed, the magnetic field distribution changes and the position in which the same magnetic field strength is obtained also changes.

As is well known, the magnetic resonance frequency is determined by the magnetic field strength. In order to generate an image normally or correctly in which body-motion artifact is sufficiently reduced, for example, it is required to maintain the magnetic resonance frequency of the region corresponding to the imaging target of the object (i.e., the imaging region) at the same value during imaging. The magnetic field strength generated by the magnets 10 does not always have uniform spatial distribution, but usually shows different values depending on its position. Thus, for example, when the object moves in an open space sandwiched between the two magnets 10 during imaging, the magnetic resonance frequency of the region corresponding to the imaging target changes depending on the motion of the object, which makes it difficult to generate a normal image.

Considering the above, in the MRI apparatus 1 of the present embodiment, the position of the object is sequentially detected by the detector 20 even when the object moves during imaging. Then, by controlling the currents applied to the respective coil units 11 and 12 on the basis of the detected position of the object, the imaging region (i.e., the region where the magnetic field strength is constant, in other words, the region where the magnetic resonance frequency is constant) is dynamically set so as to follow the motion of the object.

Various methods can be considered for determining the respective currents applied to the coil units 11 and 12 based on the detected position of the object.

For example, spatial distribution of the magnetic field to be generated by the coil units 11 and 12 is calculated in advance for each of many different drive currents, and each magnetic field distribution associated with the drive currents is stored as a database in an appropriate storage circuit of the MRI apparatus 1. As an initial condition for imaging, a desired magnetic resonance frequency $f_r$, or a desired magnetic field strength $B_0$ corresponding to the magnetic resonance frequency $f_r$, is set in advance.

The magnetic field distribution in which the desired magnetic field strength $B_0$ is obtained at the detected object position (x, y, z) is extracted from the database, and the currents associated with the extracted magnetic field distribution can be determined as the respective currents to be applied to the coil units 11 and 12.

In this case, the position (x, y, z) of the object may be detected as an absolute value at a predetermined apparatus coordinate, and the currents to be applied may be calculated as absolute values of the currents. Definition of the apparatus coordinate is not limited to a particular one. For example, the apparatus coordinate may be defined such that the origin may be the center of gravity of the coil surfaces of the respective coil units 11 and 12, the Z-axis direction is perpendicular to the coil surface (i.e., the direction of the central axis of the magnets 10), the Y-axis direction is the direction orthogonal to the Z-axis direction and extending vertically from the floor surface, and the X-axis direction is perpendicular to both of the Z-axis and Y-axis directions.

Alternatively, the position (x, y, z) of the object at the start of imaging may be set as the reference position, and the value of the applied current at the start of imaging may be set as the reference current $I_0$. In this case, the amount of increase/decrease $\Delta I$ of the applied current with respect to the reference current $I_0$ can be obtained from the movement amount ($\Delta x$, $\Delta y$, $\Delta z$) of the object after the start of imaging.

Instead of the method of calculating the current value using the database, the current value can be calculated in real time by using some mathematical formulas. For example, by using a mathematical formula based on Biot-Savart's law, the current values of the respective coil units 11 and 12 for obtaining a desired magnetic field strength $B_0$ at the position (x, y, z) of the object can be calculated in real time.

First Modification of First Embodiment

Figure 5:
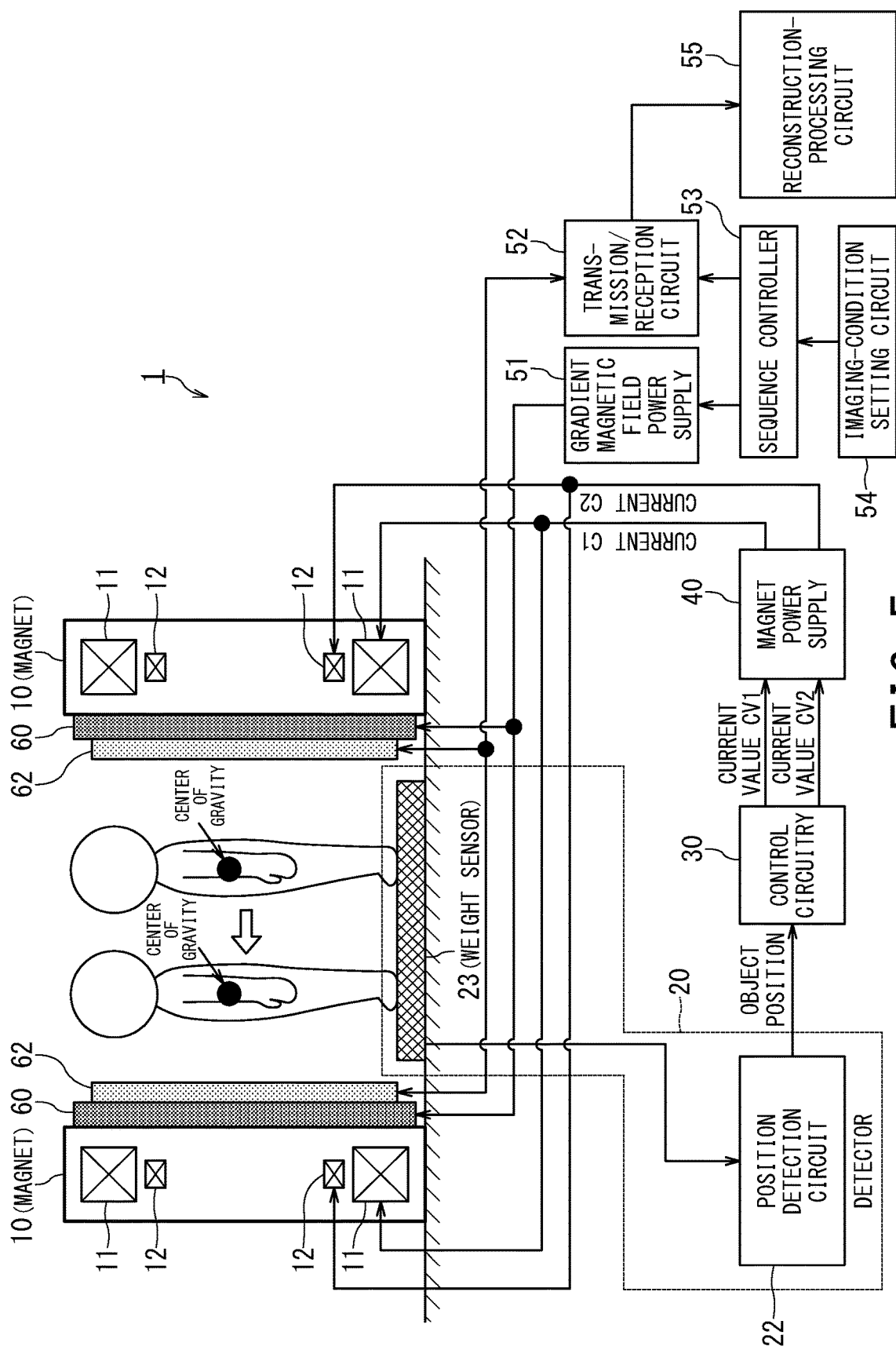
FIG. 5 is a block diagram illustrating a configuration of the MRI apparatus according to the first modification of the first embodiment.

FIG. 5 is a block diagram illustrating a configuration of the MRI apparatus 1 according to the first modification of the first embodiment. The difference between the first embodiment (FIG. 4) and the first modification lies in the configuration of the detector 20. The detector 20 of the first modification includes a weight sensor 23 and a position detection circuit 22. The weight sensor 23 is installed on the floor, for example, and detects the position of the object (for example, the position of the center of gravity). Alternatively, the weight sensor 23 may be installed on the table 80 of the bed 81, for example, and the position of the center of gravity of the object may be calculated on the basis of the height and weight of the object. Other than the weight sensor 23, the position of the object can be detected by using various sensors such as an infrared sensor or a pressure sensor.

Second Modification of First Embodiment

Figure 6:
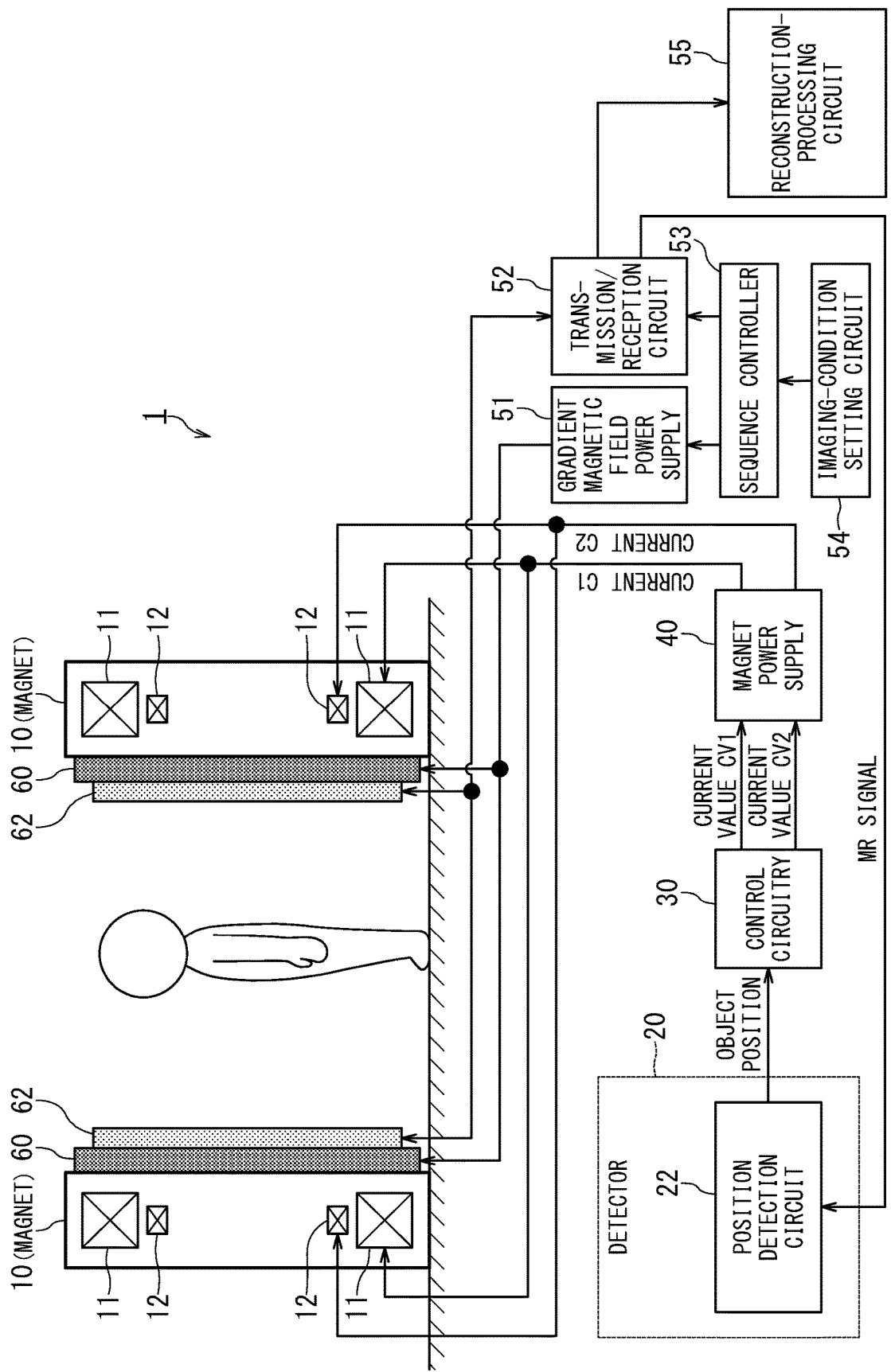
FIG. 6 is a block diagram illustrating a configuration of the MRI apparatus according to the second modification of the first embodiment.

FIG. 6 is a block diagram illustrating a configuration of the MRI apparatus 1 according to the second modification of the first embodiment. The difference between the first embodiment (FIG. 4) and the second modification also lies in the configuration of the detector 20. The detector 20 of the second modification is configured to input the magnetic resonance signal of the object before and during imaging, and detect the position of the object by using the inputted magnetic resonance signal.

The position detection circuit 22 of the second modification may detect the position of the object by reconstructing an image of the object in real time +using the magnetic resonance signals. Or, if the position of the object is limited to one specific one direction (for example, the Z-axis direction), one-dimensional Fourier transform in the specific direction may be performed in real time on the inputted magnetic resonance signals to detect the position of the object based on the peak position of the signals after the Fourier transform.

Second Embodiment

Figure 7:
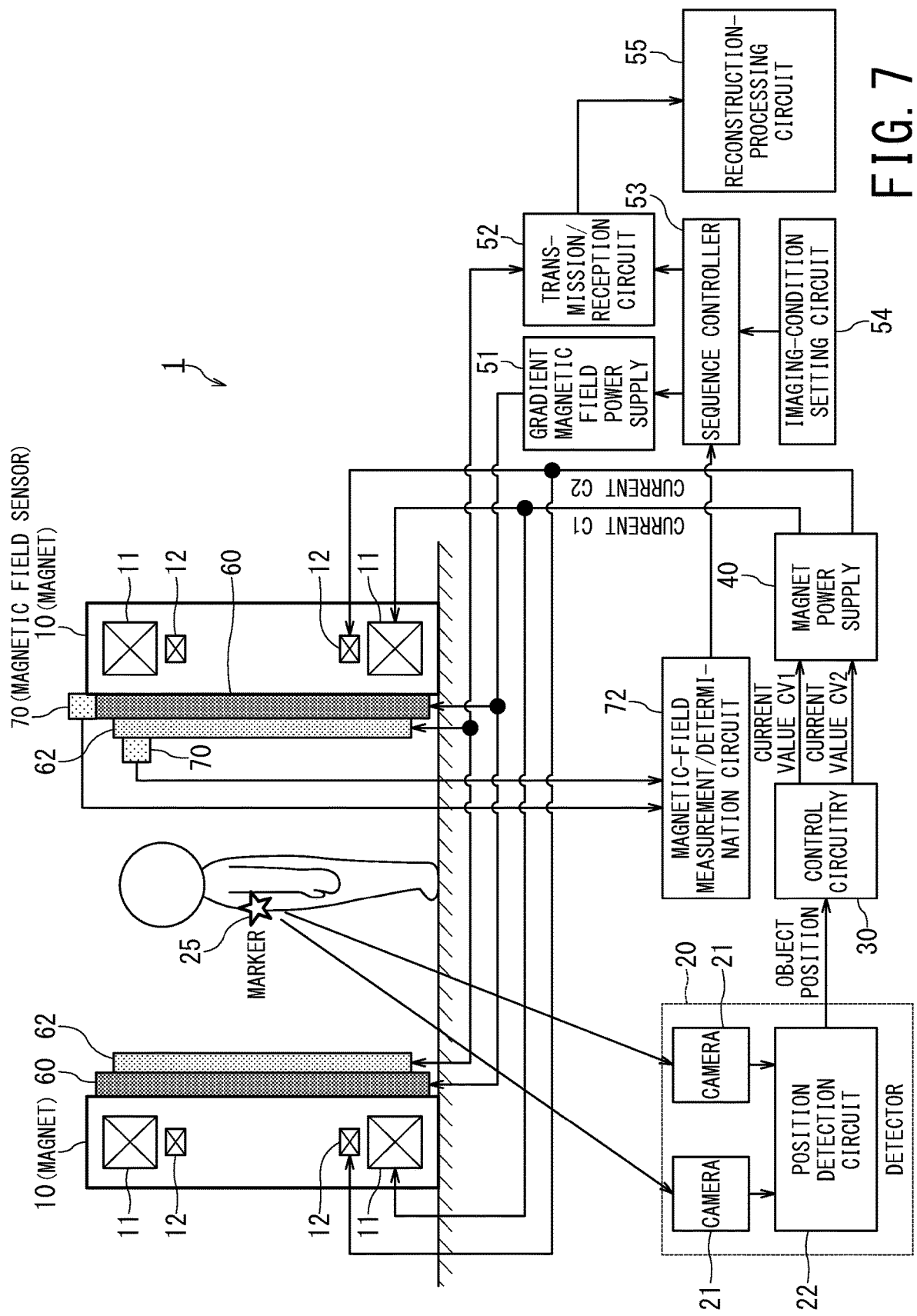
FIG. 7 is a block diagram illustrating a configuration of the MRI apparatus according to the second embodiment.

FIG. 7 is a block diagram illustrating a configuration of the MRI apparatus 1 according to the second embodiment. The MRI apparatus 1 of the second embodiment has a configuration in which a magnetic field sensor 70 and a magnetic-field measurement/determination circuit 72 are added to the configuration of the first embodiment or each modification of the first embodiment.

The magnetic field sensor 70 is configured to measure the magnetic field strength generated by the magnets 10. An NMR (Nuclear Magnetic Resonance) probe and/or a Gauss meter, for example, can be used as the magnetic field sensor 70. The position of the magnetic field sensor 70 is not limited to a specific position. The magnetic field sensor 70 may be placed in magnetic field space away from the magnet-housings that house the respective magnets 10, or may be placed close to the magnet-housing, for example, in a partial area of the gradient coil assembly 60 or the RF coil 62 as shown in FIG. 7.

Note that the magnets 10 requires some time from the start of current application to generation of desired magnetic field strength in some cases. In such cases, the magnetic-field measurement/determination circuit 72 determines whether the magnetic field generated by magnets 10 has reached a strength within a predetermined range or not based on the magnetic field strength detected by the magnetic field sensor 70. When it is determined that the magnetic field has reached the strength within the predetermined range, the magnetic-field measurement/determination circuit 72 commands the sequence controller 53 to start imaging. The sequence controller 53 automatically starts imaging by following the command. Additionally or alternatively, after it is determined that the magnetic field has reached the strength within the predetermined range, the imaging may be started by further determining whether a synchronization signal for the electrocardiographic synchronous imaging has been received.

Still additionally or alternatively, when it is determined that the magnetic field has reached the strength within a predetermined range, this determination may be notified to a user, such as an MRI technologist, by a notification means of the MRI apparatus 1, such as an appropriate display device, so that imaging can be started according to the user's operation.

Further, the magnetic-field measurement/determination circuit 72 may have a function of calibrating (i.e., tuning) the magnetic field generated by the drive current. The calibration may be performed before each start of imaging, or may be performed when the MRI apparatus 1 is installed in a medical institution such as a hospital.

Figure 8:
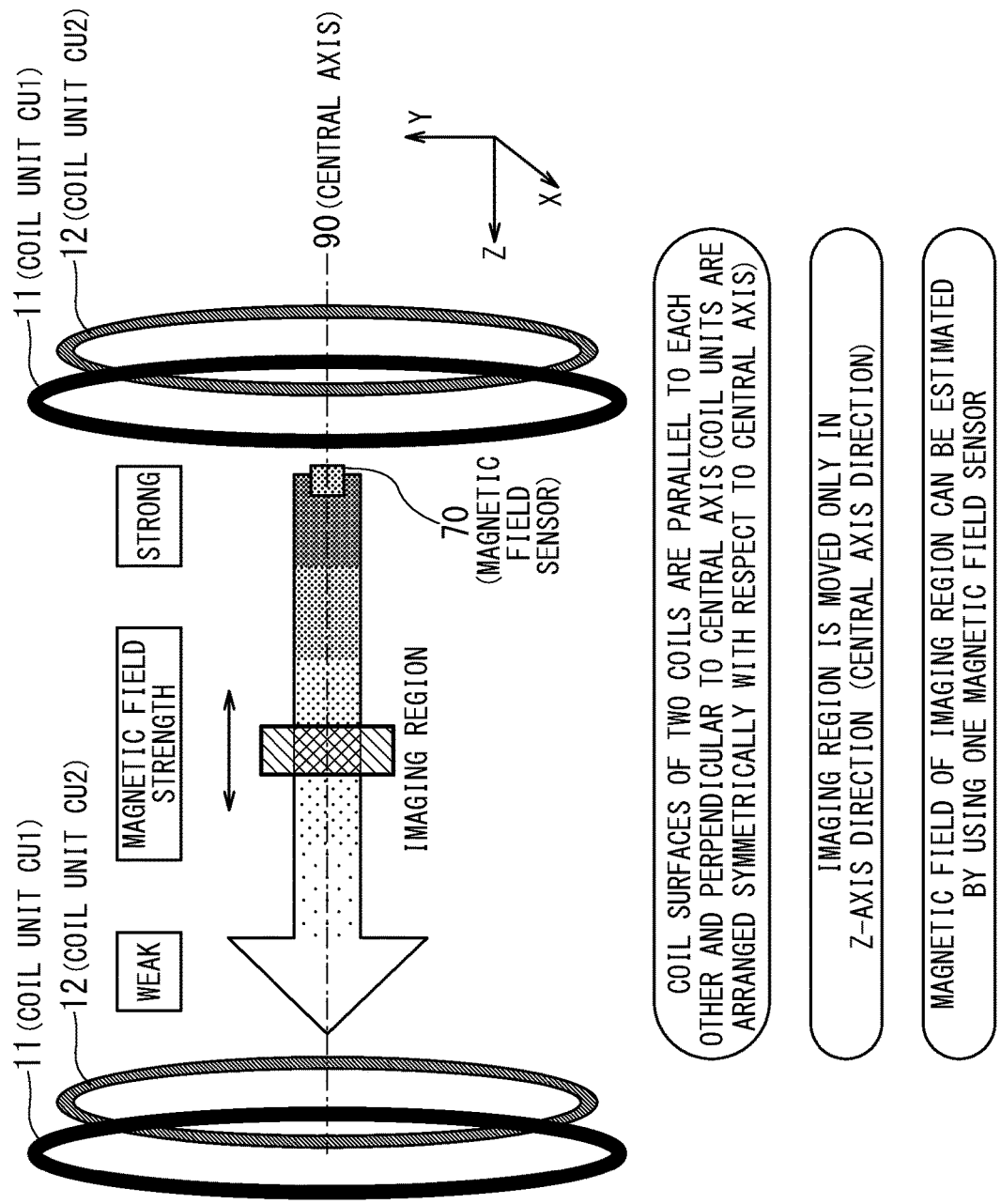
FIG. 8 is a first diagram illustrating a position of a magnetic field sensor and estimated magnetic field strength in the imaging region.
Figure 9:
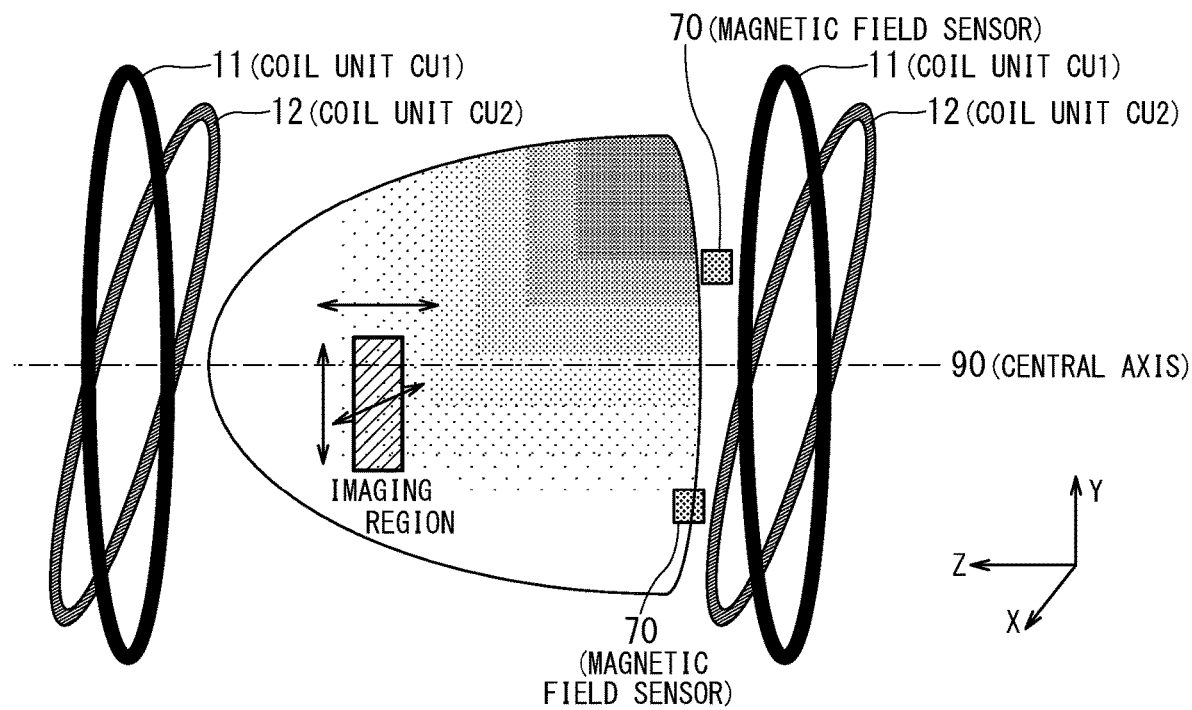
FIG. 9 is a second diagram illustrating a position of a magnetic field sensor and estimated magnetic field strength in the imaging region.

FIG. 8 and FIG. 9 illustrate locations of the magnetic field sensor(s) 70, for example, locations of the magnetic field sensor(s) 70 during calibration, and the estimated magnetic field strength of the imaging region.

FIG. 8 illustrates behavior of the magnetic field strength in the case where the two coil units 11 and 12 are arranged symmetrically with respect to the central axis 90, i.e., respective coil surfaces of a plurality of coil units included in magnets 10 (for example, the two coil units 11 and 12) are arranged to be parallel to each other and perpendicular to the central axis 90 of the magnets 10. Here, the coil surface means a plane that includes the entire circumference of the loop-shaped conducting wire constituting each coil unit 11 or 12. FIG. 8 illustrates the behavior of the magnetic field strength for the case, where a variable current is applied only to the coil units 11 and 12 of one of the two magnets 10 sandwiching the object (i.e., magnet 10 on the right side on the sheet of FIG. 8), while a constant current is applied to the coil units 11 and 12 of the other magnet 10.

In this case, depending on the magnitude of the currents to be applied, the magnetic field strength changes along the direction of the central axis 90, and the position of the imaging region corresponding to the same magnetic field strength moves along the direction of the central axis 90. In this case, the magnetic field strength of the imaging region can be estimated by using only one magnetic field sensor 70. Thus, with one magnetic field sensor 70, the magnetic field in the imaging region generated by the drive current can be calibrated.

On the other hand, FIG. 9 illustrates the behavior of the magnetic field strength in the case where the two coil units 11 and 12 are arranged asymmetrically with respect to the central axis 90. That is, the respective coil surfaces of a plurality of coil units, for example, two coil units 11 and 12 are arranged to be inclined to each other, or at least one coil surface is disposed to be inclined with respect to the central axis 90 of the magnets 10. Similar to FIG. 8, FIG. 9 illustrates the case where a variable current is applied only to the coil units 11 and 12 of one of the two magnets 10 sandwiching the object (i.e., magnet 10 on the right side on the sheet of FIG. 8), while a constant current is applied to the coil units 11 and 12 of the other magnet 10.

In this case, the distribution profile of the magnetic field strength can be changed in the X-axis, Y-axis, and Z-axis directions depending on the magnitude and direction of the current applied to each coil unit. Thus, the position of the imaging region corresponding to the same magnetic field strength can also be moved in the three-dimensional X-axis, Y-axis, and Z-axis directions. In this case, the magnetic field generated by the drive current is three-dimensionally estimated by measuring the spatial distribution of the magnetic field strength with two or more magnetic field sensors 70, which enables the control circuitry 30 to calibrate three-dimensionally the spatial distribution of the magnetic field strength of the imaging region generated by the drive currents.

Other Embodiments

Figures 10A, 10B:
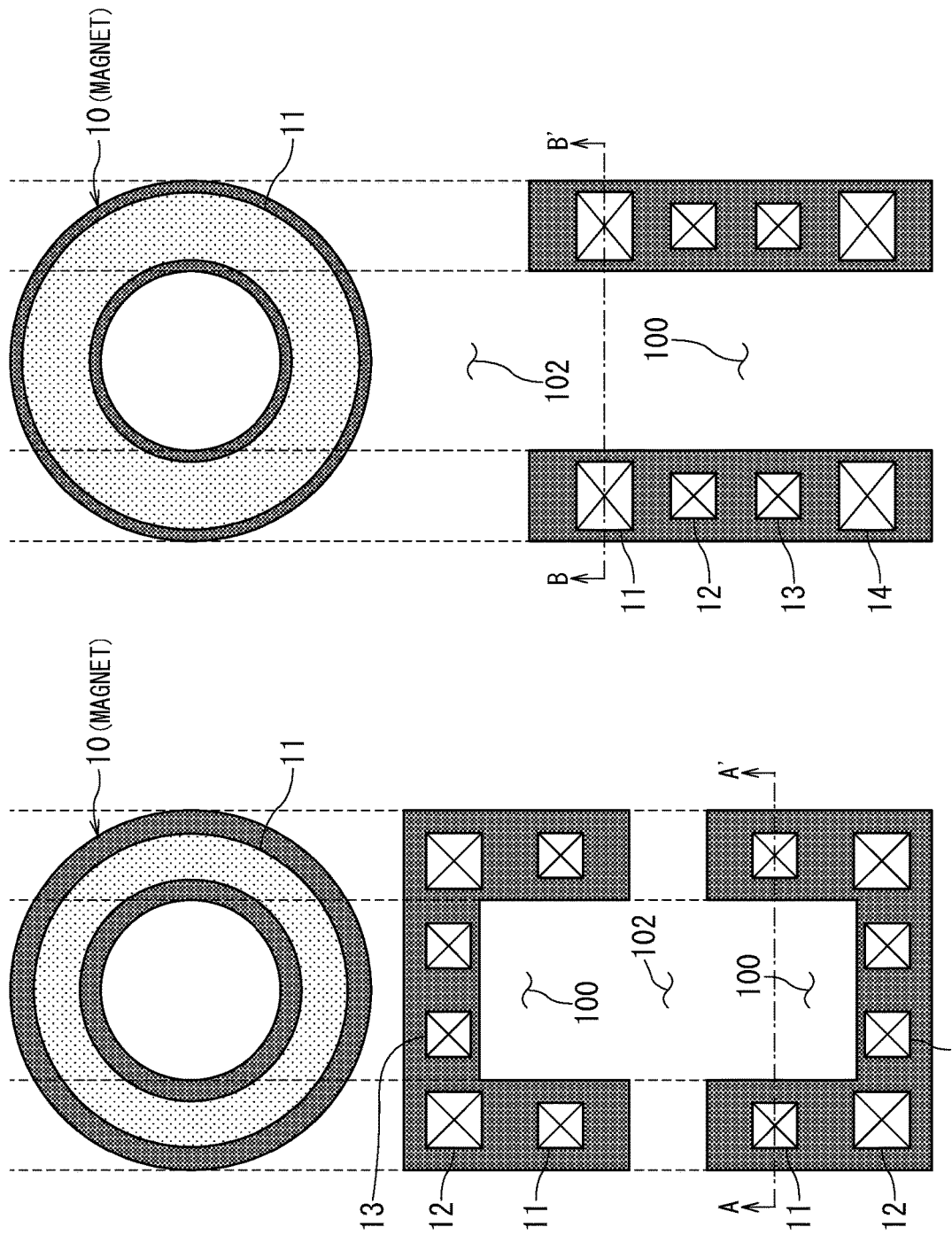
FIG. 10A and FIG. 10B are diagrams illustrating configurations of the magnet(s) according to other embodiments.

FIG. 10A and FIG. 10B illustrate configurations of the magnets 10 of the MRI apparatus 1 according to other embodiments. Although the flat plate-shaped magnets 10 as shown in FIG. 3 have been described so far, the magnets 10 of the MRI apparatus 1 are not limited to the flat plate-shaped magnet. In this case, neither the gradient coil assembly 60 nor the RF coil 62 is limited to a flat plate shape.

For example, as shown in FIG. 10A, each of the two magnets 10 may have a cylindrical shape in which one end face is open and the other end face is closed. Further, as shown in FIG. 10B, there may be only one magnet 10 having a cylindrical shape with both end faces open, similar to the cylindrical magnet provided in the conventional MRI apparatus.

The upper part of FIG. 10A is a cross-sectional view taken along the line A-A' in the lower part of FIG. 10A. The magnets 10 shown in FIG. 10A include a plurality of coil units, for example, coil units 11, 12, and 13. In such magnets 10, the imaging space may be the closed space 100 inside the cylinder of the magnets 10 or the open space 102 between the two magnets 10.

Meanwhile, the upper part of FIG. 10B is a B-B' cross-sectional view of the lower part of FIG. 10B. The magnet shown in FIG. 10B includes a plurality of coil units, for example, coil units 11, 12, 13, and 14. In such a magnet 10, the imaging space may be the closed space 100 inside the cylinder of the magnet 10 or may be the open space 102 away from the cylinder of the magnet 10.

So far, a description has been given of the embodiments in which the MRI apparatus 1 has two magnets 10 sandwiching the object as illustrated in FIG. 1, FIG. 2, FIG. 4 to FIG. 9. However, the MRI apparatus 1 of embodiments is not limited to such a configuration. For example, the MRI apparatus 1 may be provided with only one of the two magnets 10 sandwiching the object, and even in such a configuration with only one magnet 10, the above-described technical effects can be obtained.

According to at least one embodiment as described above, in imaging by using a planar open magnet MRI apparatus, an image of the object can be generated normally even if the object moves during imaging.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
   a current-driven magnet configured to generate a magnetic field that predominantly determines a magnetic resonance frequency by applying a drive current to one or more coils of the current-driven magnet so as to change a spatial distribution of the magnetic field;
   a detector configured to detect a position of an object to be imaged in a movable state in the magnetic field; and
   control circuitry configured to set an imaging region of the object depending on a motion of the object by controlling the drive current of the current-driven magnet based on the detected position of the object.

2. The MRI apparatus according to claim 1, wherein:
   the current-driven magnet is composed of at least one coil unit;
   the at least one coil unit is housed in a flat plate-shaped housing; and
   the object is positioned away from the flat plate-shaped housing in a central axis direction of the current-driven magnet, when being imaged.

3. The MRI apparatus according to claim 1, wherein:
the current-driven magnet is composed of at least one coil unit;
the at least one coil unit is housed in a cylindrical housing;
at least one of both end faces of the cylindrical housing is open; and
the object is positioned in an internal space of the cylindrical housing or positioned away from the cylindrical housing in a central axis direction of the current-driven magnet, when being imaged.

4. The MRI apparatus according to claim 2, wherein:
the at least one coil unit is disposed in such a manner that respective coil surfaces of each of the at least one coil unit is perpendicular to a central axis of the current-driven magnet; and
the imaging region is set to be movable along a direction of the central axis of the current-driven magnet.

5. The MRI apparatus according to claim 3, wherein:
the at least one coil unit is disposed in such a manner that respective coil surfaces of each of the at least one coil unit is perpendicular to a central axis of the current-driven magnet; and
the imaging region is set to be movable along a direction of the central axis of the current-driven magnet.

6. The MRI apparatus according to claim 2, wherein:
the at least one coil unit includes planar coils having two or more coil surfaces,
the two or more coil surfaces are disposed to be inclined with each other; and
the imaging region is set to be independently movable in three directions including a central axis direction of the current-driven magnet, a first direction perpendicular to the central axis direction, and a second direction perpendicular to both of the central axis direction and the first direction.

7. The MRI apparatus according to claim 3, wherein:
the at least one coil unit includes planar coils having two or more coil surfaces,
the two or more coil surfaces are disposed to be inclined with each other; and
the imaging region is set to be independently movable in three directions including a central axis direction of the current-driven magnet, a first direction perpendicular to the central axis direction, and a second direction perpendicular to both of the central axis direction and the first direction.

8. The MRI apparatus according to claim 1, wherein the detector includes a camera configured to detect a position of a marker that is attached to the object, or a marker that is attached to a radio frequency (RF) coil mounted on the object.

9. The MRI apparatus according to claim 1, wherein the detector includes a sensor configured to detect the position of the object.

10. The MRI apparatus according to claim 1, wherein the detector includes a position detection circuit configured to detect the position of the object based on a magnetic resonance signal emitted from the object.

11. The MRI apparatus according to claim 1, wherein the control circuitry is configured to set the imaging region of the object in accordance with the motion of the object based on a database in which spatial distribution of the magnetic field and the driving current are associated with each other, the database being obtained in advance of imaging of the object.

12. The MRI apparatus according to claim 1, wherein the control circuitry is configured to calculate the drive current in real time based on a position of the imaging region to be set.

13. The MRI apparatus according to claim 1, further comprising at least one magnetic field sensor configured to measure magnetic field strength generated by the current-driven magnet.

14. The MRI apparatus according to claim 13, wherein the control circuitry is configured to cause the MRI apparatus to start imaging of the object when the magnetic field strength measured by the magnetic field sensor falls within a predetermined range.

15. The MRI apparatus according to claim 13, wherein the control circuitry is configured to use the magnetic field strength measured by the magnetic field sensor for calibrating the magnetic field generated by the drive current.

* * * * *